(12) United States Patent
Ding et al.

(10) Patent No.: US 10,291,291 B2
(45) Date of Patent: May 14, 2019

(54) CONTACTLESS COMMUNICATION DEVICE WITH DIFFERENTIAL RECEIVER INPUT VOLTAGE STABILIZATION

(71) Applicant: NXP B.V., Eindhoven (NL)

(72) Inventors: Jingfeng Ding, Gratkorn (AT); Gernot Hueber, Gratkorn (AT); Stefan Mendel, Gratkorn (AT)

(73) Assignee: NXP B.V., Eindhoven (NL)

( * ) Notice: Subject to any disclaimer, the term of this patent is extended or adjusted under 35 U.S.C. 154(b) by 77 days.

(21) Appl. No.: 15/646,955

(22) Filed: Jul. 11, 2017

(65) Prior Publication Data
US 2019/0020374 A1    Jan. 17, 2019

(51) Int. Cl.
| | |
|---|---|
| G05F 3/02 | (2006.01) |
| H03G 1/00 | (2006.01) |
| H03L 7/08 | (2006.01) |
| H04B 5/00 | (2006.01) |
| H04L 25/02 | (2006.01) |
| H04W 88/02 | (2009.01) |

(52) U.S. Cl.
CPC ............ *H04B 5/0025* (2013.01); *G05F 3/02* (2013.01); *H03G 1/0035* (2013.01); *H03L 7/0807* (2013.01); *H04L 25/0272* (2013.01); *H04L 25/0292* (2013.01); *H03G 2201/106* (2013.01); *H04W 88/02* (2013.01)

(58) Field of Classification Search
None
See application file for complete search history.

(56) References Cited

U.S. PATENT DOCUMENTS

| | | | |
|---|---|---|---|
| 9,853,752 B2 | 12/2017 | Ding et al. | |
| 9,960,735 B1 | 5/2018 | Ding et al. | |
| 2009/0011730 A1* | 1/2009 | Liang | H03G 3/004 455/127.2 |
| 2015/0295608 A1 | 10/2015 | Merlin et al. | |

\* cited by examiner

*Primary Examiner* — David Bilodeau (57) ABSTRACT

A contactless communication device includes a receiver unit having differential input terminals for connecting to an antenna. The receiver unit is coupled to a transmitting device and receives an RF signal transmitted by the transmitting device. A first comparator is adapted to generate a first comparator output signal indicative of a relationship between a voltage at a positive input terminal of the receiver unit and a first reference voltage. A second comparator is adapted to generate a second comparator output signal indicative of a relationship between a voltage at a negative input terminal of the receiver unit and a second reference voltage. A first voltage regulation circuit is adapted to regulate the voltage at the positive input terminal in response to the first comparator output signal. A second voltage regulation circuit is adapted to regulate the voltage at the negative input terminal in response to the second comparator output signal.

12 Claims, 6 Drawing Sheets

CONTACTLESS COMMUNICATION DEVICE WITH DIFFERENTIAL RECEIVER INPUT VOLTAGE STABILIZATION

The present disclosure generally relates to contactless communication devices, in particular to contactless communication devices having differential receiver input voltage stabilization.

Near field communication (NFC) is a form of contactless communication between devices like smartphones or tablets. Contactless communication allows a user to wave the smartphone over a NFC compatible device to send information without needing to touch the devices together or go through multiple steps setting up a connection.

Contactless communication devices may employ a differential receiver unit having differential input terminals for receiving differential input signals. In some cases, the differential input signals received at the differential input terminals of the receive unit are not symmetric, which may be caused by component variations of the antenna matching circuit used for such devices and/or the use of a balanced to unbalanced (Balun) transformer for converting a single ended antenna to differential receiver inputs. The asymmetric behavior may cause reduced sensitivity, saturation of the received signal, common mode disturbances of the differential receiving stages, to name just a few.

As a result, there exists a need for improving the robustness of a differential receiver unit in a contactless communication device.

SUMMARY

A contactless communication device includes a receiver unit having differential input terminals for connecting to an antenna. The differential input terminals of the receiver unit include a positive input terminal and a negative input terminal. The contactless communication device includes a first comparator adapted to generate a first comparator output signal indicative of a relationship between a voltage at the positive input terminal of the receiver unit and a first reference voltage and a second comparator adapted to generate a second comparator output signal indicative of a relationship between a voltage at the negative input terminal of the receiver unit and a second reference voltage. The contactless communication device further includes a first voltage regulation circuit coupled to the first comparator and to the positive input terminal of the receiver unit and a second voltage regulation circuit coupled to the second comparator and to the negative input terminal of the receiver unit. The first voltage regulation circuit is adapted to regulate the voltage at the positive input terminal in response to the first comparator output signal. The second voltage regulation circuit is adapted to regulate the voltage at the negative input terminal in response to the second comparator output signal.

In one embodiment, the first voltage regulation circuit is adapted to regulate an amplitude and a phase of the voltage at the positive input terminal of the receiver unit.

In one embodiment, the second voltage regulation circuit is adapted to regulate an amplitude and a phase of the voltage at the negative input terminal of the receiver unit.

In one embodiment, the first voltage regulation circuit is adapted to regulate an amplitude of the voltage at the positive input terminal of the receiver unit.

In one embodiment, the second voltage regulation circuit is adapted to regulate an amplitude of the voltage at the negative input terminal of the receiver unit.

In one embodiment, the first voltage regulation circuit comprises a controller and a first programmable attenuator connected to the positive input terminal of the receiver unit.

In one embodiment, the second voltage regulation circuit comprises the controller and a second programmable attenuator connected to the negative input terminal of the receiver unit.

In one embodiment, the first programmable attenuator includes a first M-bit controlled resistor array and a first N-bit controlled capacitor array. The first M-bit controlled resistor array is adapted to regulate an amplitude of the voltage at the positive input terminal of the receiver unit, and the first N-bit controlled capacitor array is adapted to regulate a phase of the voltage at the positive input terminal of the receiver unit.

In one embodiment, the second programmable attenuator includes a second M-bit controlled resistor array and a second N-bit controlled capacitor array. The second M-bit controlled resistor array is adapted to regulate an amplitude of the voltage at the negative input terminal of the receiver unit, and the second N-bit controlled capacitor array is adapted to regulate a phase of the voltage at the negative input terminal of the receiver unit.

In one embodiment, the first programmable attenuator includes a first M-bit controlled resistor array. The first M-bit controlled resistor array is adapted to regulate an amplitude of the voltage at the positive input terminal of the receiver unit.

In one embodiment, the second programmable attenuator includes a second M-bit controlled resistor array. The second M-bit controlled resistor array is adapted to regulate an amplitude of the voltage at the negative input terminal of the receiver unit.

In one embodiment, the contactless communication device is incorporated in a mobile device and adapted to be powered by the mobile device.

A contactless communication device includes a receiver unit having differential input terminals for connecting to an antenna. The differential input terminals of the receiver unit include a positive input terminal and a negative input terminal. The contactless communication device includes a comparator adapted to generate a comparator output signal indicative of a relationship between a voltage at a selected one of the positive input terminal and the negative input terminal of the receiver unit and a reference voltage. The contactless communication device further includes a first voltage regulation circuit coupled to the first comparator and to the positive input terminal of the receiver unit and a second voltage regulation circuit coupled to the second comparator and to the negative input terminal of the receiver unit. The first voltage regulation circuit is adapted to regulate a voltage at the positive input terminal in response to the comparator output signal if the positive input terminal is selected. The second voltage regulation circuit is adapted to regulate a voltage at the negative input terminal in response to the comparator output signal if the negative input terminal is selected.

In one embodiment, the first voltage regulation circuit is adapted to regulate an amplitude and a phase of the voltage at the positive input terminal of the receiver unit.

In one embodiment, the second voltage regulation circuit is adapted to regulate an amplitude and a phase of the voltage at the negative input terminal of the receiver unit.

In one embodiment, the first voltage regulation circuit is adapted to regulate an amplitude of the voltage at the positive input terminal of the receiver unit.

In one embodiment, the second voltage regulation circuit is adapted to regulate an amplitude of the voltage at the negative input terminal of the receiver unit.

In one embodiment, the first voltage regulation circuit comprises a controller and a first programmable attenuator connected to the positive input terminal of the receiver unit.

In one embodiment, the second voltage regulation circuit comprises the controller and a second programmable attenuator connected to the negative input terminal of the receiver unit.

In one embodiment, the first programmable attenuator includes a first M-bit controlled resistor array and a first N-bit controlled capacitor array. The first M-bit controlled resistor array being adapted to regulate an amplitude of the voltage at the positive input terminal of the receiver unit, and the first N-bit controlled capacitor array being adapted to regulate a phase of the voltage at the positive input terminal of the receiver unit.

In one embodiment, the second programmable attenuator includes a second M-bit controlled resistor array and a second N-bit controlled capacitor array. The second M-bit controlled resistor array is adapted to regulate an amplitude of the voltage at the negative input terminal of the receiver unit, and the second N-bit controlled capacitor array is adapted to regulate a phase of the voltage at the negative input terminal of the receiver unit.

In one embodiment, the first programmable attenuator includes a first M-bit controlled resistor array. The first M-bit controlled resistor array being adapted to regulate an amplitude of the voltage at the positive input terminal of the receiver unit.

In one embodiment, the second programmable attenuator includes a second M-bit controlled resistor array. The second M-bit controlled resistor array is adapted to regulate an amplitude of the voltage at the negative input terminal of the receiver unit.

A contactless communication device includes a receiver unit having differential input terminals for connecting to an antenna. The differential input terminals of the receiver unit include a positive input terminal and a negative input terminal. The contactless communication device includes a first voltage regulation circuit coupled to the positive input terminal of the receiver unit. The first voltage regulation circuit is adapted to regulate a voltage at the positive input terminal in response to a first output signal of the receiver unit. The first output signal includes information related to the voltage at the positive input terminal of the receiver unit. The contactless communication device further includes a second voltage regulation circuit coupled to the negative input terminal of the receiver unit. The second voltage regulation circuit is adapted to regulate a voltage at the negative input terminal in response to a second output signal of the receiver unit. The second output signal includes information related to the voltage at the negative input terminal of the receiver unit.

In one embodiment, the first voltage regulation circuit is adapted to regulate an amplitude of the voltage at the positive input terminal of the receiver unit.

In one embodiment, the second voltage regulation circuit is adapted to regulate an amplitude of the voltage at the negative input terminal of the receiver unit.

In one embodiment, the first voltage regulation circuit comprises a controller and a first programmable attenuator connected to the positive input terminal of the receiver unit.

In one embodiment, the second voltage regulation circuit comprises the controller and a second programmable attenuator connected to the negative input terminal of the receiver unit.

A method for stabilizing differential input voltages of a receiver unit in a contactless communication device. The method includes receiving differential input voltages at differential input terminals of the receiver unit. Said receiving differential input voltages includes receiving a voltage at a positive input terminal of the receiver unit and receiving a voltage at a negative input terminal of the receiver unit. The method includes generating a first comparator output signal indicative of a relationship between the voltage at the positive input terminal of the receiver unit and a first reference voltage and generating a second comparator output signal indicative of a relationship between the voltage at the negative input terminal of the receiver unit and a second reference voltage. The method further includes regulating the voltage at the positive input terminal of the receiver unit in response to the first comparator output signal and regulating the voltage at the negative input terminal of the receiver unit in response to the second comparator output signal.

In one embodiment, regulating the voltage at the positive input terminal of the receiver unit includes regulating an amplitude and a phase of the voltage at the positive input terminal of the receiver unit.

In one embodiment, regulating the voltage at the negative input terminal of the receiver unit includes regulating an amplitude and a phase of the voltage at the negative input terminal of the receiver unit.

A method for stabilizing differential input voltages of a receiver unit in a contactless communication device. The method includes receiving differential input voltages at differential input terminals of the receiver unit, and generating a comparator output signal indicative of a relationship between a voltage at a selected one of a positive input terminal and a negative input terminal of the receiver unit and a reference voltage. The method further includes regulating a voltage at the positive input terminal of the receiver unit in response to the comparator output signal if the positive input terminal is selected and regulating a voltage at the negative input terminal of the receiver unit in response to the comparator output signal if the negative input terminal is selected.

A method for stabilizing differential input voltages of a receiver unit in a contactless communication device. The method includes receiving differential input voltages at differential input terminals of the receiver unit. Said receiving differential input voltages includes receiving a voltage at a positive input terminal of the receiver unit and receiving a voltage at a negative input terminal of the receiver unit. The method includes outputting a first signal by the receiver unit, wherein said first output signal includes information related to the voltage at the positive input terminal of the receiver unit, and outputting a second signal by the receiver unit, wherein said second output signal includes information related to the voltage at the negative input terminal of the receiver unit. The method further includes regulating the voltage at the positive input terminal of the receiver unit in response to the first output signal and regulating the voltage at the negative input terminal of the receiver unit in response to the second output signal.

The above discussion is not intended to represent every example embodiment or every implementation within the scope of the current or future Claim sets.

Various example embodiments may be more completely understood in consideration of the following Detailed Description in connection with the accompanying Drawings.

BRIEF DESCRIPTION OF THE DRAWINGS

It is noted that in different figures, similar or identical elements are provided with the same reference signs or with reference signs, which differ only within the first digit.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Figure 1:
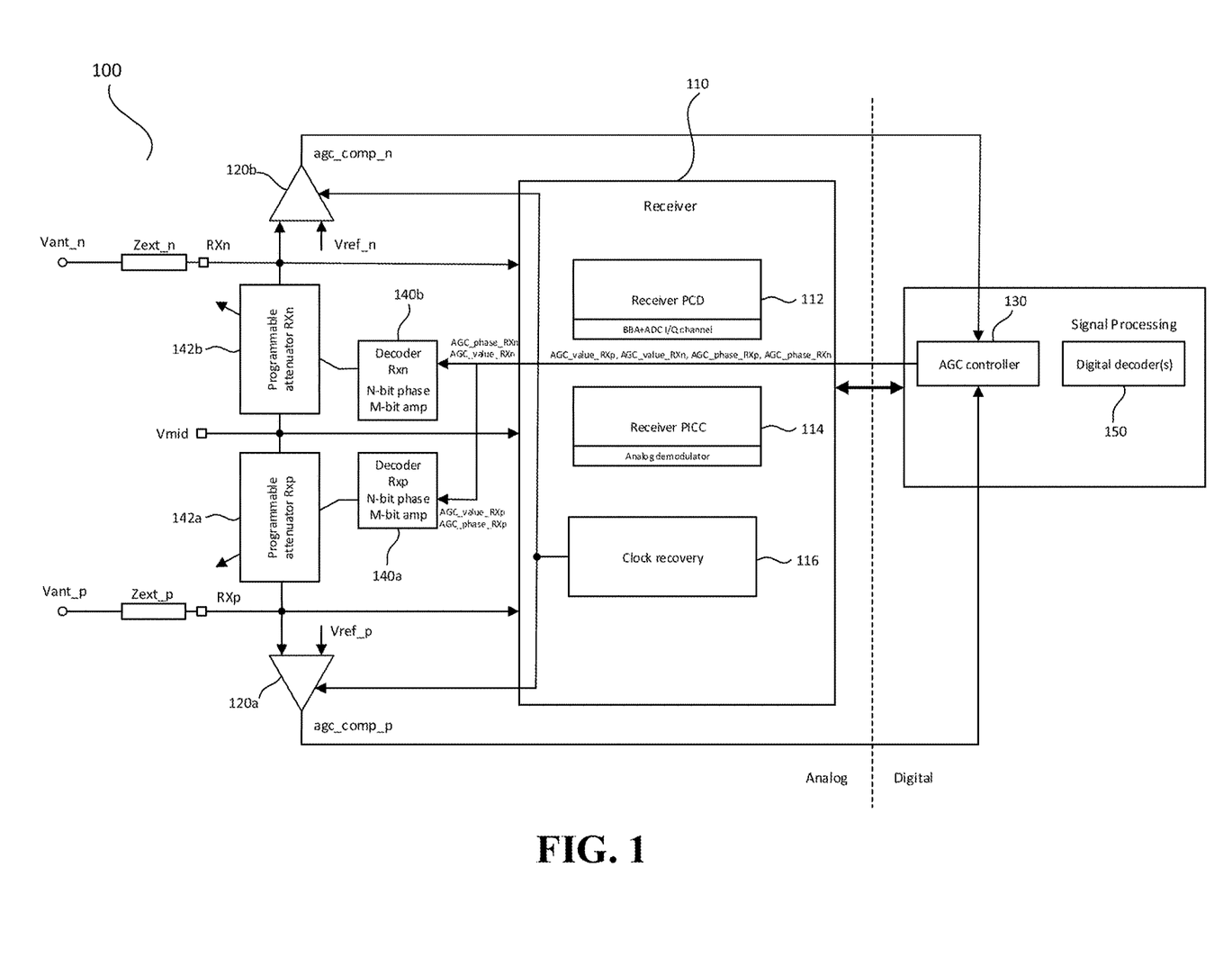
FIG. 1 is a first embodiment of a contactless communication device.

FIG. 1 shows a first embodiment of a contactless communication device 100. More specifically, the contactless communication device 100 comprises a receiver unit 110, comparators 120a and 120b, an AGC controller 130, decoders 140a and 140b, programmable attenuators 142a and 142b, and a signal processor 150. As indicated by the dashed line, the receiver unit 110, the comparators 120a and 120b, the decoders 140a and 140b, and the programmable attenuators 142a and 142b are analog components while the controller 130 and the signal processor 150 are digital components. For the sake of completeness, it is noted that the contactless communication device 100 comprises further units and components which are not shown in FIG. 1 as these are not of particular relevance for the present invention.

The receiver unit 110 comprises a proximity coupling device (PCD) receiver module 112 with baseband amplifier (BBA) and I/Q channel ADCs for operating in reader-mode, a proximity integrated circuit card (PICC) receiver module 114 with analog demodulator(s) for operating in card-mode, and a clock recovery module 116 for providing a recovered clock signal derived from an incoming RF field from a transmitting device (not shown). In the present embodiment, the receiver unit 110 is a differential receiver having a positive input terminal RXp, a negative input terminal RXn and a reference input terminal Vmid. The programmable attenuator 142a is arranged between RXp and Vmid, and the programmable attenuator 142b is arranged between RXn and Vmid.

Returning to the embodiment of FIG. 1, the comparator 120a is arranged to receive a voltage at the positive input terminal RXp of the receiver unit as one input and a reference voltage Vref_p as another input. The reference voltage Vref_p may be programmable at the production stage. The comparator 120a also receives the recovered clock signal from the receiver unit 110 such that the comparator 120a can compare the peak voltage at RXp with Vref_p and output a one-bit comparator output signal agc_comp_p indicating whether the peak voltage at the positive input terminal RXp is larger or smaller than the reference voltage Vref_p.

Likewise, the comparator 120b is arranged to receive a voltage at the negative input terminal RXn of the receiver unit as one input and a reference voltage Vref_n as another input. The reference voltage Vref_n may be programmable at the production stage. The comparator 120b also receives the recovered clock signal from the receiver unit 110 such that the comparator 120b can compare the peak voltage at RXn with Vref_n and output a one-bit comparator output signal agc_comp_n indicating whether the peak voltage at the negative input terminal RXn is larger or smaller than the reference voltage Vref_n.

The AGC controller 130 receives the comparator output signal agc_comp_p from the comparator 120a and generates control signals AGC_value_RXp for adjusting the amplitude of the receiver input voltage at the positive input terminal RXp and AGC_phase_RXp for adjusting the phase of the receiver input voltage at the positive input terminal RXp. Similarly, the AGC controller 130 receives the comparator output signal agc_comp_n from the comparator 120b and generates control signals AGC_value_RXn for adjusting the amplitude of the receiver input voltage at the negative input terminal RXn and AGC_phase_RXn for adjusting the phase of the receiver input voltage at the negative input terminal RXn.

The decoder 140a receives the control signals AGC_value_RXp and AGC_phase_RXp from the controller 130 and converts the value of AGC_value_RXp into an M-bit thermometer (or unary) coded control signal and the value of AGC_phase_RXp into an N-bit thermometer (or unary) coded control signal, which will be used by the programmable attenuator 142a to adjust the amplitude and phase of the receiver input voltage at the positive input terminal RXp as will be described below with reference to FIG. 6A. For example, let us assume that the control signal AGC_value_RXp is a 10-bit signal having possible values ranging from 0 to 1023, then the decoder 140a receives the 10-bit control signal and converts the 10-bit value of AGC_value_RXp into a 1023-bit thermometer (or unary) coded control signal.

Likewise, the decoder 140b receives the control signals AGC_value_RXn and AGC_phase_RXn from the controller 130 and converts the value of AGC_value_RXn into an M-bit thermometer (or unary) coded control signal and the value of AGC_phase_RXn into an N-bit thermometer (or unary) coded control signal, which will be used by the programmable attenuator 142b to adjust the amplitude and phase of the receiver input voltage at the negative input terminal RXn as will be described below with reference to FIG. 6A.

The programmable attenuator 142a adjusts the amplitude of the input voltage at the positive input terminal of the receiver unit based on the M-bit thermometer (or unary) coded control signal received from the decoder 140a and adjusts the phase of the input voltage at the positive input terminal of the receiver unit based on the N-bit thermometer (or unary) coded control signal received from the decoder 140a as described below with reference to FIG. 6A. Similarly, the programmable attenuator 142b adjusts the amplitude of the input voltage at the negative input terminal of the receiver unit based on the M-bit thermometer (or unary) coded control signal received from the decoder 140b and adjusts the phase of the input voltage at the negative input terminal of the receiver unit based on the N-bit thermometer (or unary) coded control signal received from the decoder 140b as described below with reference to FIG. 6A.

Figure 6A:
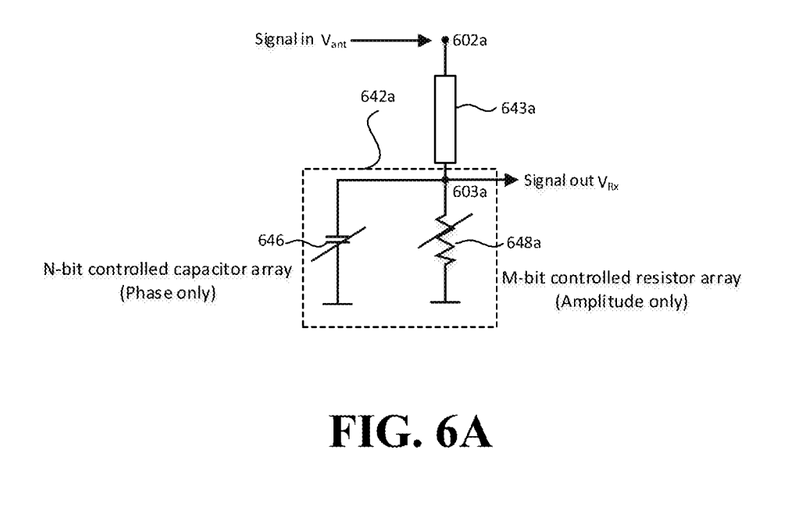
FIG. 6A is an embodiment of a programmable attenuator.

FIG. 6A depicts an embodiment of a programmable attenuator 642a. More specifically, the programmable attenuator 642a comprises an M-bit controlled resistor array 648a with a programmable resistance and an N-bit controlled capacitor array 646 with a programmable capacitance. The M-bit controlled resistor array 648a is controlled by the M-bit thermometer (or unary) coded control signal (also known as M-bit attenuation factor code) received from the decoder 140a or 140b. In an embodiment, the M-bit controlled resistor array 648a includes a number of resistors and each of the resistors in the resistor array can be enabled or disabled (e.g., bypassed) by the M-bit attenuation factor code to generate a particular resistance value to regulate the amplitude of the receiver input voltage. In an embodiment, the M-bit controlled resistor array 648a is an M-bit programmable resistive voltage divider.

The N-bit controlled capacitor array 646 is controlled by the N-bit thermometer (or unary) coded control signal (also known as N-bit attenuation factor code) received from the decoder 140a or 140b. In an embodiment, the N-bit controlled capacitor array includes a number of capacitors and each of the capacitors can be enabled or disabled (e.g., bypassed) by the N-bit attenuation factor code to generate a particular capacitance value to regulate the phase of the receiver input voltage. In an embodiment, the N-bit controlled capacitor array 646 is an N-bit programmable capacitive voltage divider.

The programmable attenuator 642a depicted in FIG. 6A is just one possible implementation of the programmable attenuator (142a, 142b) depicted in FIG. 1. However, the programmable attenuator (142a, 142b) depicted in FIG. 1 is not limited to the embodiment shown in FIG. 6A.

In the embodiment depicted in FIG. 6A, an RF signal $V_{ant}$ ($V_{ant\_p}$, $V_{ant\_n}$) is received at the input terminal 602a and an output signal $V_{Rx}$ (the voltages received at RXp and RXn respectively) is output from the output terminal 603a. The output signal $V_{Rx}$ may be an attenuated version of the received RF signal $V_{ant}$ or identical to the received RF signal. The impedance 643a is connected to the input terminal 602a from which the RF signal is received and the M-bit controlled resistor array 648a is connected to ground.

The embodiment of FIG. 1 as described above discloses a contactless communication device and method thereof for stabilizing differential inputs of a differential receiver unit. In particular, two separate voltage regulation circuits are employed for stabilizing the differential signals received at RXp and RXn. In addition, embodiment of FIG. 1 is adapted to not only regulate the amplitude of the voltages received at the differential input terminals but also adjust the phase of input signals of the differential receiver unit. In this manner, asymmetric differential inputs received at RXp and RXn are fully compensated thereby improving the overall system performance.

Figure 2:
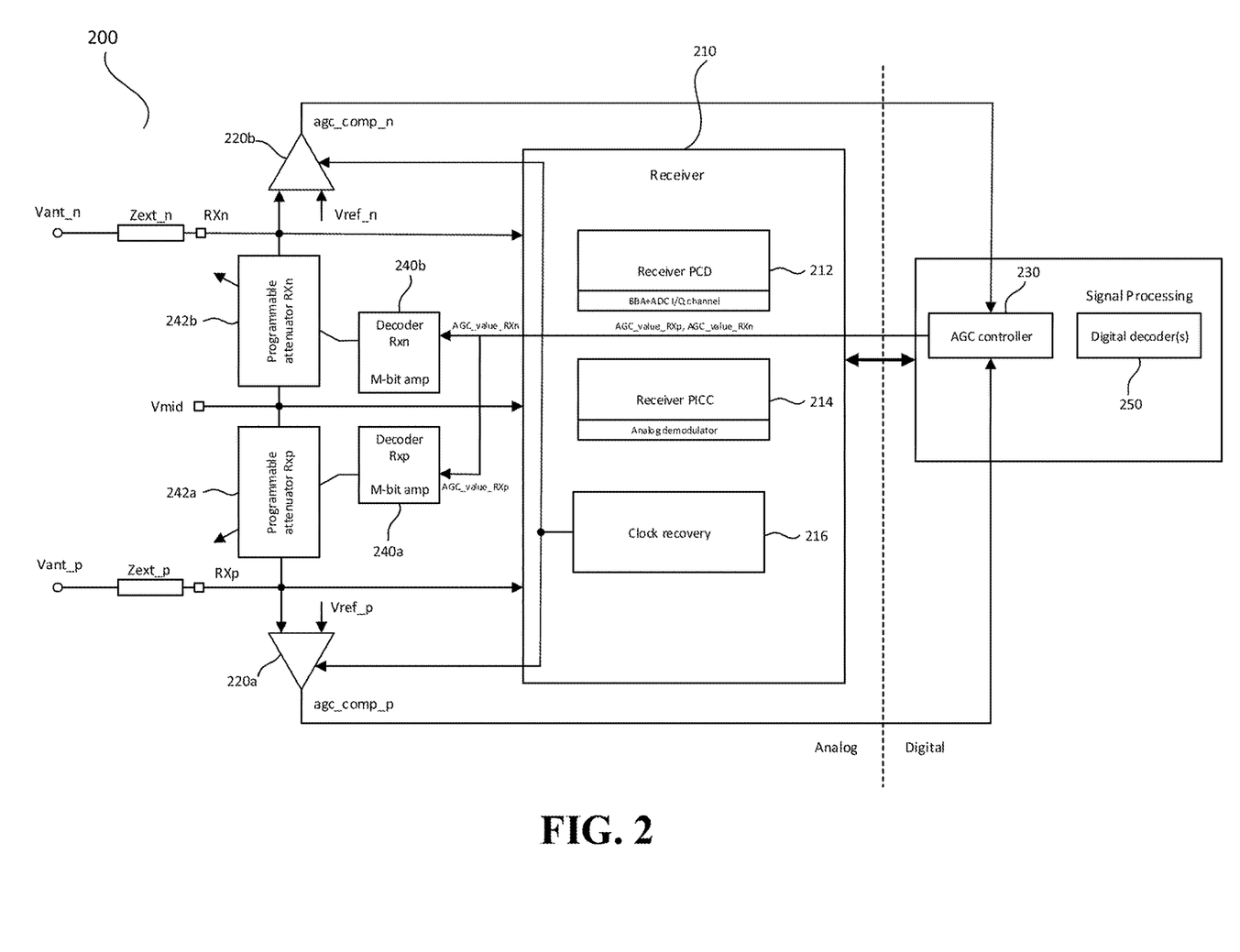
FIG. 2 is a second embodiment of a contactless communication device.

FIG. 2 is a second embodiment of a contactless communication device 200. This second embodiment and the embodiment of FIG. 1 have much in common, and thus would not be explained in further detail. The main difference lies in that the embodiment of FIG. 1 discloses regulating both the amplitude and phase of the differential input signals received at RXp and RXn, whereas the embodiment of FIG. 2 discloses regulating only the amplitude of the differential input signals. More specifically, the programmable attenuators (242a, 242b) of FIG. 2 are adapted to regulate the amplitude of the respective input voltages received at RXp and RXn of the receiver unit. The programmable attenuators (242a, 242b) of FIG. 2 may be implemented according to FIG. 6B as described below.

Figure 6B:
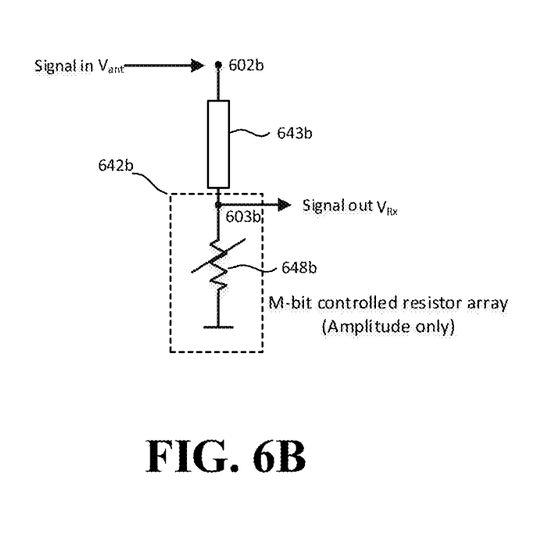
FIG. 6B is an alternative embodiment of the programmable attenuator.

FIG. 6B depicts an alternative embodiment of the programmable attenuator. More specifically, the programmable attenuator 642b comprises an M-bit controlled resistor array 648b with a programmable resistance. The M-bit controlled resistor array 648b is controlled by the M-bit thermometer (or unary) coded control signal (M-bit attenuation factor code) received from the decoder 242a or 242b. In an embodiment, the M-bit controlled resistor array 648b includes a number of resistors and each of the resistors in the resistor array can be enabled or disabled (e.g., bypassed) by the M-bit attenuation factor code to generate a particular resistance value to regulate the amplitude of the respective input voltages received at RXp and RXn of the receiver unit. In an embodiment, the M-bit controlled resistor array 648b is an M-bit programmable resistive voltage divider.

In the embodiment depicted in FIG. 6B, an RF signal $V_{ant}$ ($V_{ant\_p}$, $V_{ant\_n}$) is received at the input terminal 602b and an output signal $V_{Rx}$ (the voltages received at RXp and RXn respectively) is output from the output terminals 603b. The output signal $V_{Rx}$ may be an attenuated version of the received RF signal or identical to the received RF signal. The impedance 643b is connected to the input terminal 602b from which the RF signal is received and the M-bit controlled resistor array 648b is connected to ground.

Figure 3:
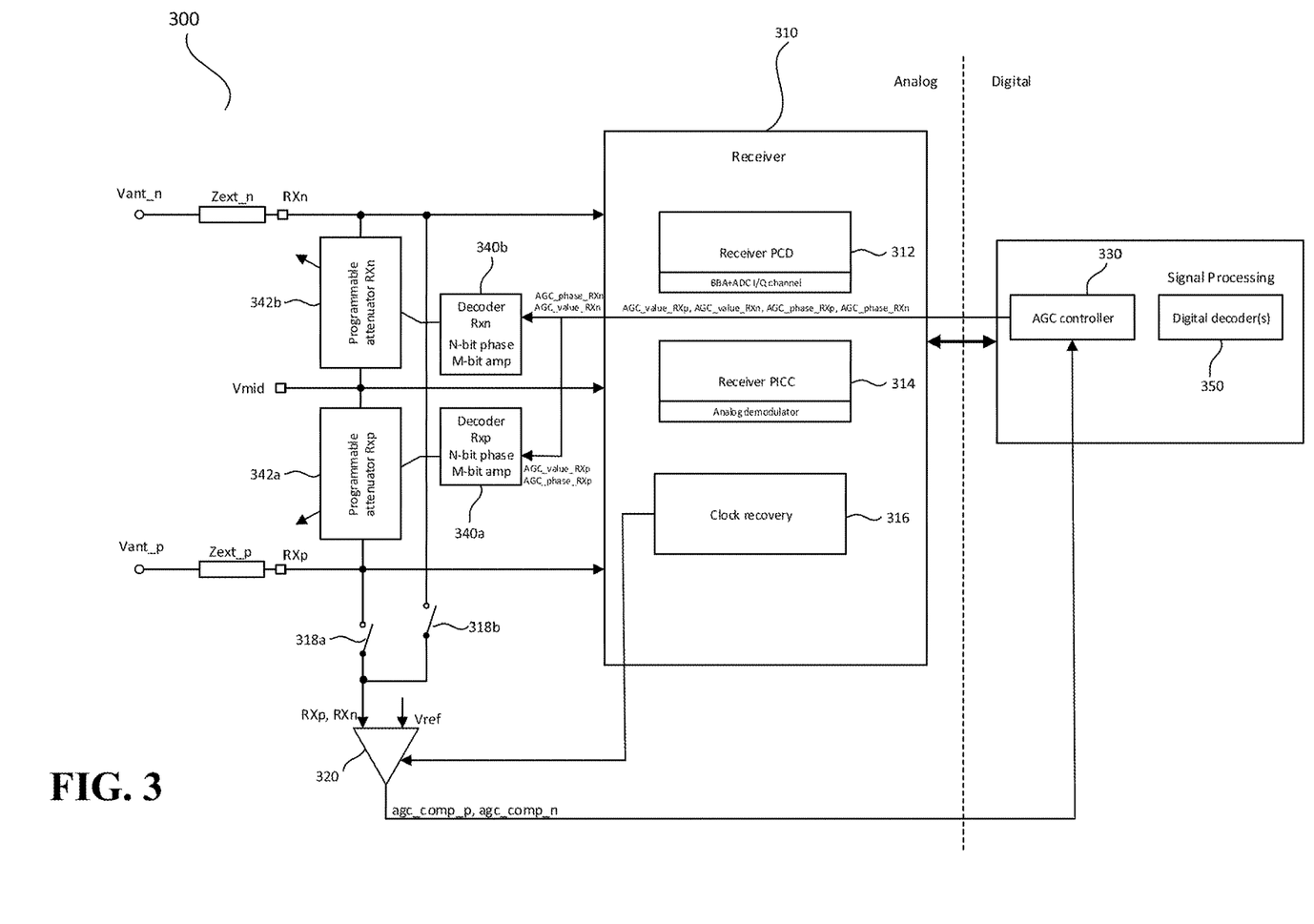
FIG. 3 is a third embodiment of a contactless communication device.

FIG. 3 shows another embodiment of a contactless communication device 300. More specifically, the contactless communication device 300 comprises a receiver unit 310, a comparator 320, an AGC controller 330, decoders 340a and 340b, programmable attenuators 342a and 342b, and a signal processor 350. As indicated by the dashed line, the receiver unit 310, the comparator 320, the decoders 340a and 340b, and the programmable attenuators 342a and 342b are analog components while the controller 330 and the signal processor 350 are digital components. For the sake of completeness, it is noted that the contactless communication device 300 comprises further units and components which are not shown in FIG. 3 as these are not of particular relevance for the present invention.

The receiver unit 310 comprises a PCD receiver module 312 with baseband amplifier (BBA) and I/Q channel ADCs for operating in reader-mode, a PICC receiver module 314 with analog demodulator(s) for operating in card-mode, and a clock recovery module 316 for providing a recovered clock signal derived from an incoming RF field from a transmitting device (not shown). In the present embodiment, the receiver unit 310 is a differential receiver having a positive input terminal RXp, a negative input terminal RXn and a reference input terminal Vmid. The programmable attenuator 342a is arranged between RXp and Vmid, and the programmable attenuator 342b is arranged between RXn and Vmid.

The comparator 320 is arranged to receive a voltage at a selected one of the positive input terminal RXp and the negative input terminal RXn of the receiver unit as one input and a reference voltage Vref as another input. In one embodiment, selecting one of the positive input terminal RXp and the negative input terminal RXn of the receiver unit is determined by the AGC controller 330. If the positive input terminal RXp is selected, then the switch 318a is closed, such that the voltage at the positive input terminal RXp is received at the comparator 320 as one of the input (the other input is Vref). On the other hand, if the negative input terminal RXn is selected, then the switch 318b is closed, such that the voltage at the negative input terminal RXn is received at the comparator 320 as one of the input (the other input is Vref). The reference voltage Vref may be programmable at the production stage.

The comparator 320 also receives the recovered clock signal from the receiver unit 310 such that the comparator 320 can compare the peak voltage at the selected one of RXp and RXn with Vref and output a one-bit comparator output signal indicating whether the peak voltage at the selected one of RXp and RXn is larger or smaller than the reference voltage Vref. That is, if the positive input terminal RXp is selected, then the comparator 320 compares the peak voltage at RXp with Vref and outputs a one-bit comparator output signal agc_comp_p indicating whether the peak voltage at RXp is larger or smaller than the reference voltage Vref. On the other hand, if the negative input terminal RXn is selected, then the comparator 320 compares the peak voltage at RXn with Vref and outputs a one-bit comparator output signal agc_comp_n indicating whether the peak voltage at RXn is larger or smaller than the reference voltage Vref.

If the AGC controller 330 receives the comparator output signal agc_comp_p from the comparator 320, it generates control signals AGC_value_RXp for adjusting the amplitude of the receiver input voltage at the positive input terminal RXp and AGC_phase_RXp for adjusting the phase of the receiver input voltage at the positive input terminal RXp. Likewise, if the AGC controller 330 receives the comparator output signal agc_comp_n from the comparator 320, it generates control signals AGC_value_RXn for adjusting the amplitude of the receiver input voltage at the negative input terminal RXn and AGC_phase_RXn for adjusting the phase of the receiver input voltage at the negative input terminal RXn.

The decoder 340a receives the control signals AGC_value_RXp and AGC_phase_RXp from the controller 330 and converts the value of AGC_value_RXp into an M-bit thermometer (or unary) coded control signal and also converts the value of AGC_phase_RXp into an N-bit thermometer (or unary) coded control signal, which are used by the programmable attenuator 342a to adjust the amplitude and phase of the receiver input voltage at the positive input terminal RXp as described above with reference to FIG. 6A.

Likewise, the decoder 340b receives the control signals AGC_value_RXn and AGC_phase_RXn from the controller 330 and converts the value of AGC_value_RXn into an M-bit thermometer (or unary) coded control signal and also converts the value of AGC_phase_RXn into an N-bit thermometer (or unary) coded control signal, which are used by the programmable attenuator 342b to adjust the amplitude and phase of the receiver input voltage at the negative input terminal RXn.

The embodiment of FIG. 3 as described above discloses a contactless communication device and method thereof for stabilizing differential inputs of a differential receiver unit in the contactless communication device. In particular, two separate voltage regulation circuits are employed for stabilizing the differential signals received at the receiver unit by regulating both the amplitude and the phase of the voltages received at the differential input terminals of the receiver unit. In this manner, asymmetric differential inputs received at the differential input terminals RXp and RXn are fully compensated thereby improving the overall system performance.

Figure 4:
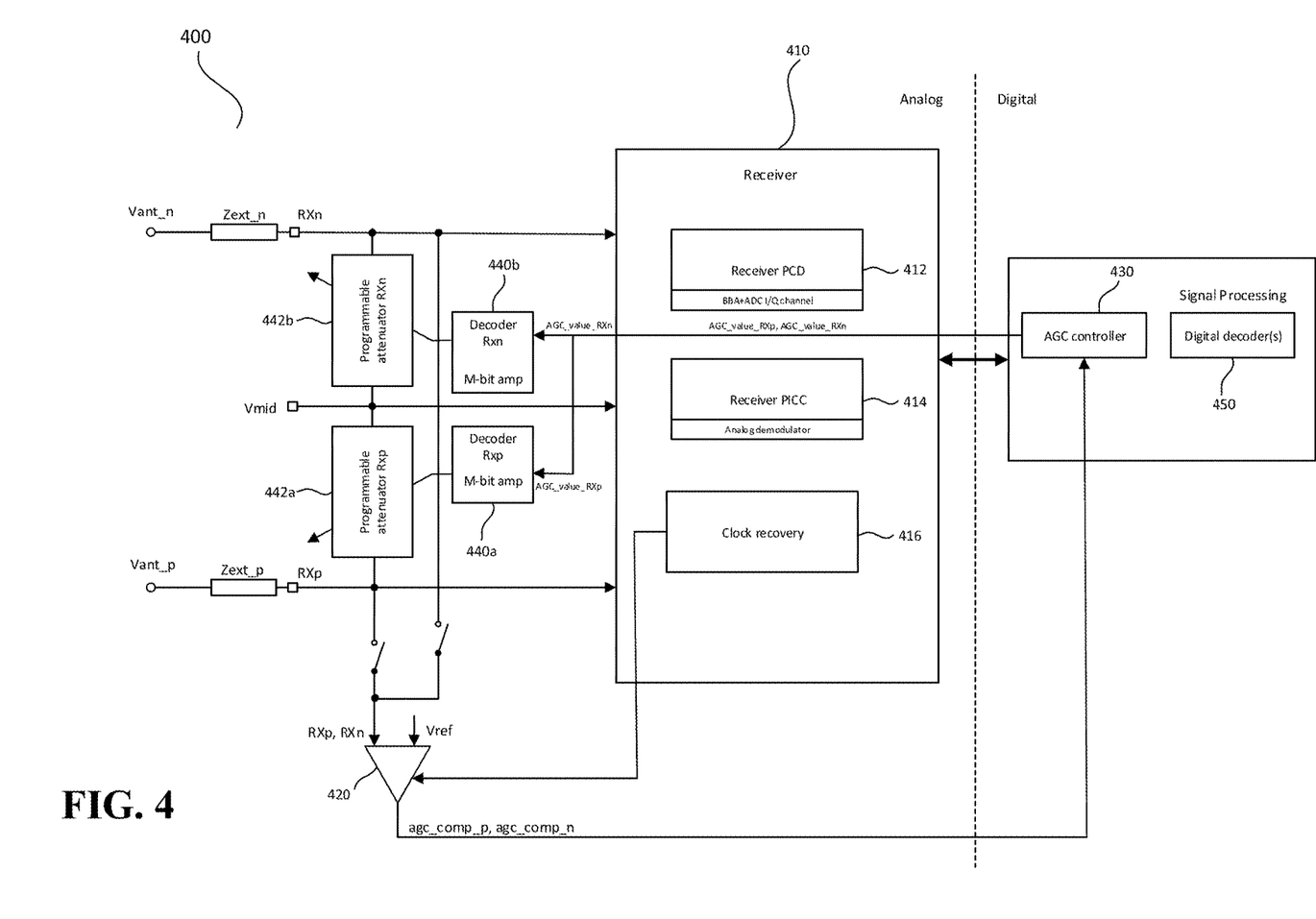
FIG. 4 is a fourth embodiment of a contactless communication device.

FIG. 4 is another embodiment of a contactless communication device 400. This embodiment and the embodiment of FIG. 3 have much in common, and thus would not be explained in further detail. The main difference lies in that the embodiment of FIG. 3 discloses regulating both the amplitude and phase of the differential input signals received at RXp and RXn, whereas the embodiment of FIG. 4 discloses regulating only the amplitude of the differential input signals. More specifically, the programmable attenuators (442a, 442b) of FIG. 4 are adapted to regulate the amplitude of the respective input voltages received at RXp and RXn of the receiver unit. The programmable attenuators (442a, 442b) of FIG. 4 may be implemented according to FIG. 6B as described above.

Figure 5:
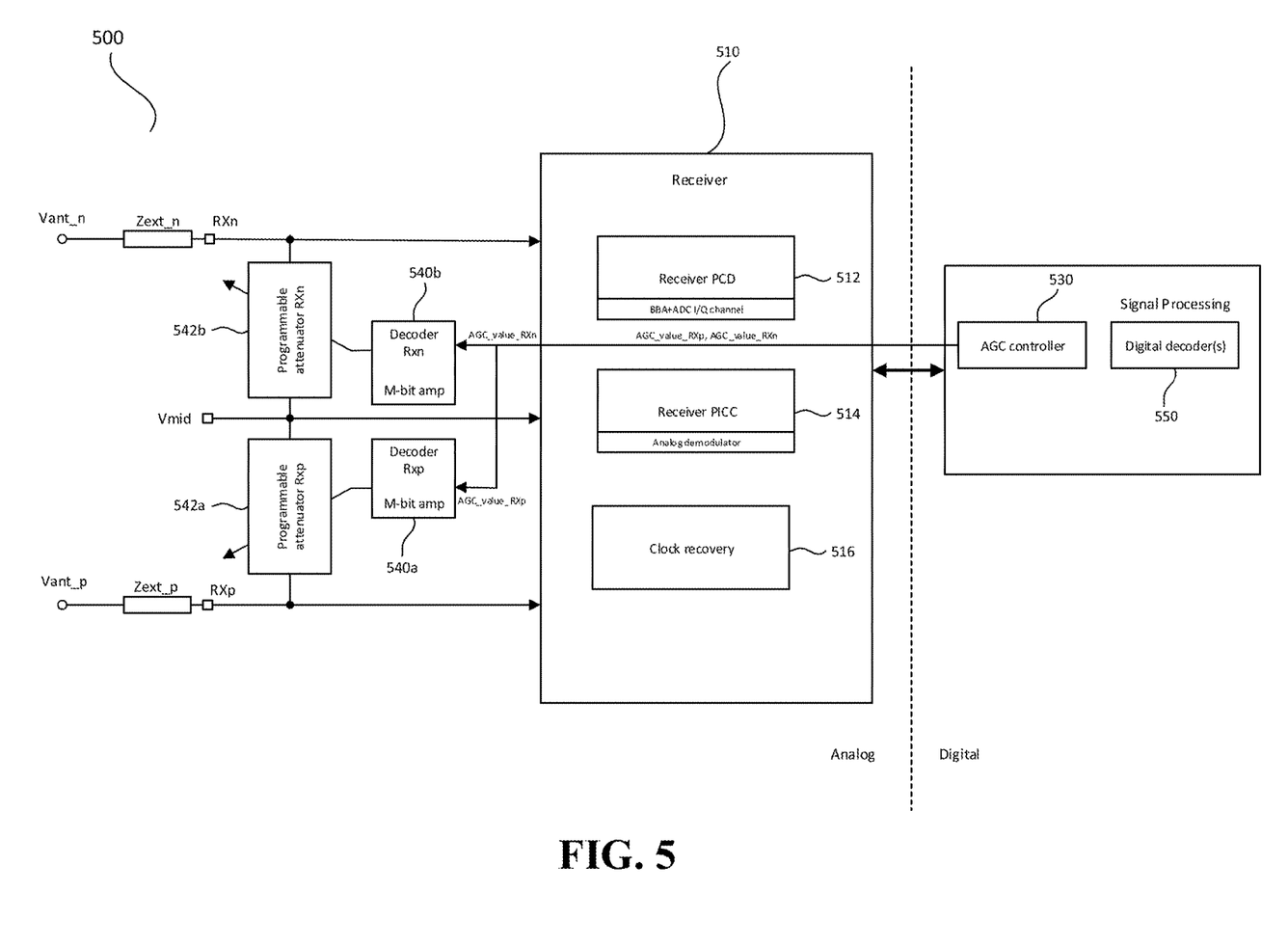
FIG. 5 is a fifth embodiment of a contactless communication device.

FIG. 5 shows another embodiment of a contactless communication device 500. More specifically, the contactless communication device 500 comprises a receiver unit 510, an AGC controller 530, decoders 540a and 540b, programmable attenuators 542a and 542b, and a signal processor 550. As indicated by the dashed line, the receiver unit 510, the comparator 520, the decoders 540a and 540b, and the programmable attenuators 542a and 542b are analog components while the controller 530 and the signal processor 550 are digital components. For the sake of completeness, it is noted that the contactless communication device 500 comprises further units and components which are not shown in FIG. 5 as these are not of particular relevance for the present invention.

The receiver unit 510 comprises a PCD receiver module 512 with baseband amplifier (BBA) and I/Q channel ADCs for operating in reader-mode, a PICC receiver module 514 with analog demodulator(s) for operating in card-mode, and a clock recovery module 516 for providing a recovered clock signal derived from an incoming RF field from a transmitting device (not shown). In the present embodiment, the receiver unit 510 is a differential receiver having a positive input terminal RXp, a negative input terminal RXn and a reference input terminal Vmid. The programmable attenuator 542a is arranged between RXp and Vmid, and the programmable attenuator 542b is arranged between RXn and Vmid.

Returning to the embodiment of FIG. 5, the receiver unit 510 may output a first signal including information related to the voltage at the positive input terminal RXp of the receiver unit. The receiver unit 510 may also output a second signal including information related to the voltage at the negative input terminal RXn of the receiver unit. In one embodiment, the receiver unit 510 outputs the first signal and the second signal at different time instances. In one embodiment, the first signal and the second signal may be a digital signal derived from an ADC (not shown) of the receiver unit.

If the AGC controller 530 receives a first output signal including information related to the voltage at the positive input terminal RXp from the receiver unit 510, it generates control signal AGC_value_RXp for adjusting the amplitude of the receiver input voltage at the positive input terminal RXp. Likewise, if the AGC controller 530 receives a second output signal including information related to the voltage at the negative input terminal RXn from the receiver unit 510, it generates control signal AGC_value_RXn for adjusting the amplitude of the receiver input voltage at the negative input terminal RXn.

The decoder 540a receives the control signal AGC_value_RXp from the controller 530 and converts the value of AGC_value_RXp into an M-bit thermometer (or unary) coded control signal, which is used by the programmable attenuator 542a to adjust the amplitude of the receiver input voltage at the positive input terminal RXp as described above with reference to FIG. 6B.

Likewise, the decoder 540b receives the control signal AGC_value_RXn from the controller 530 and converts the value of AGC_value_RXn into an M-bit thermometer (or unary) coded control signal, which is used by the programmable attenuator 542b to adjust the amplitude of the receiver input voltage at the negative input terminal RXn as described above with reference to FIG. 6B.

The embodiment of FIG. 5 as described above discloses a contactless communication device and method thereof for stabilizing differential inputs of a differential receiver unit in the contactless communication device. In particular, two separate voltage regulation circuits are employed for stabilizing the differential signals received at the receiver unit by regulating the amplitude of the voltages received at the differential input terminals of the receiver unit. In this manner, asymmetric differential inputs received at the differential input terminals RXp and RXn are fully compensated thereby improving the overall system performance.

It should be noted that the above-mentioned embodiments illustrate rather than limit the invention, and that those skilled in the art will be able to design many alternative embodiments without departing from the scope of the appended claims. It is intended that the following claims cover all possible example embodiments.

In the claims, any reference signs placed between parentheses shall not be construed as limiting the claim. The word "comprising" does not exclude the presence of elements or steps other than those listed in a claim. The indefinite article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

What is claimed is:

1. A contactless communication device comprising:
a receiver unit having differential input terminals for connecting to an antenna, said differential input terminals of the receiver unit including a positive input terminal and a negative input terminal;
a first comparator adapted to generate a first comparator output signal indicative of a relationship between a voltage at the positive input terminal of the receiver unit and a first reference voltage;
a second comparator adapted to generate a second comparator output signal indicative of a relationship between a voltage at the negative input terminal of the receiver unit and a second reference voltage;
a first voltage regulation circuit coupled to the first comparator and to the positive input terminal of the receiver unit, the first voltage regulation circuit being adapted to regulate the voltage at the positive input terminal in response to the first comparator output signal; and
a second voltage regulation circuit coupled to the second comparator and to the negative input terminal of the receiver unit, the second voltage regulation circuit being adapted to regulate the voltage at the negative input terminal in response to the second comparator output signal.

2. The contactless communication device of claim 1, wherein the first voltage regulation circuit is adapted to regulate an amplitude and a phase of the voltage at the positive input terminal of the receiver unit; and
wherein the second voltage regulation circuit is adapted to regulate an amplitude and a phase of the voltage at the negative input terminal of the receiver unit.

3. The contactless communication device of claim 1, wherein the first voltage regulation circuit is adapted to regulate an amplitude of the voltage at the positive input terminal of the receiver unit; and
wherein the second voltage regulation circuit is adapted to regulate an amplitude of the voltage at the negative input terminal of the receiver unit.

4. The contactless communication device of claim 1, wherein the first voltage regulation circuit comprises a controller and a first programmable attenuator connected to the positive input terminal of the receiver unit; and
wherein the second voltage regulation circuit comprises the controller and a second programmable attenuator connected to the negative input terminal of the receiver unit.

5. The contactless communication device of claim 4, wherein the first programmable attenuator includes a first M-bit controlled resistor array and a first N-bit controlled capacitor array, the first M-bit controlled resistor array being adapted to regulate an amplitude of the voltage at the positive input terminal of the receiver unit, the first N-bit controlled capacitor array being adapted to regulate a phase of the voltage at the positive input terminal of the receiver unit; and
wherein the second programmable attenuator includes a second M-bit controlled resistor array and a second N-bit controlled capacitor array, the second M-bit controlled resistor array being adapted to regulate an amplitude of the voltage at the negative input terminal of the receiver unit, the second N-bit controlled capacitor array being adapted to regulate a phase of the voltage at the negative input terminal of the receiver unit.

6. The contactless communication device of claim 4, wherein the first programmable attenuator includes a first M-bit controlled resistor array, the first M-bit controlled resistor array being adapted to regulate an amplitude of the voltage at the positive input terminal of the receiver unit; and
wherein the second programmable attenuator includes a second M-bit controlled resistor array, the second M-bit controlled resistor array being adapted to regulate an amplitude of the voltage at the negative input terminal of the receiver unit.

7. The contactless communication device of claim 1, wherein said device is incorporated in a mobile device and adapted to be powered by the mobile device.

8. A contactless communication device comprising:
a receiver unit having differential input terminals for connecting to an antenna, said differential input terminals of the receiver unit including a positive input terminal and a negative input terminal;
a comparator adapted to generate a comparator output signal indicative of a relationship between a voltage at a selected one of the positive input terminal and the negative input terminal of the receiver unit and a reference voltage;
a first voltage regulation circuit coupled to the comparator and to the positive input terminal of the receiver unit, the first voltage regulation circuit being adapted to regulate a voltage at the positive input terminal in response to the comparator output signal if the positive input terminal is selected; and a second voltage regulation circuit coupled to the comparator and to the negative input terminal of the receiver unit, the second voltage regulation circuit being adapted to regulate a voltage at the negative input terminal in response to the comparator output signal if the negative input terminal is selected;

wherein the first voltage regulation circuit comprises a controller and a first programmable attenuator connected to the positive input terminal of the receiver unit;

wherein the second voltage regulation circuit comprises the controller and a second programmable attenuator connected to the negative input terminal of the receiver unit;

wherein the first programmable attenuator includes a first M-bit controlled resistor array and a first N-bit controlled capacitor array, the first M-bit controlled resistor array being adapted to regulate an amplitude of the voltage at the positive input terminal of the receiver unit, the first N-bit controlled capacitor array being adapted to regulate a phase of the voltage at the positive input terminal of the receiver unit; and wherein the second programmable attenuator includes a second M-bit controlled resistor array and a second N-bit controlled capacitor array, the second M-bit controlled resistor array being adapted to regulate an amplitude of the voltage at the negative input terminal of the receiver unit, the second N-bit controlled capacitor array being adapted to regulate a phase of the voltage at the negative input terminal of the receiver unit.

9. A contactless communication device comprising:

a receiver unit having differential input terminals for connecting to an antenna, said differential input terminals of the receiver unit including a positive input terminal and a negative input terminal;

a comparator adapted to generate a comparator output signal indicative of a relationship between a voltage at a selected one of the positive input terminal and the negative input terminal of the receiver unit and a reference voltage;

a first voltage regulation circuit coupled to the comparator and to the positive input terminal of the receiver unit, the first voltage regulation circuit being adapted to regulate a voltage at the positive input terminal in response to the comparator output signal if the positive input terminal is selected; and a second voltage regulation circuit coupled to the comparator and to the negative input terminal of the receiver unit, the second voltage regulation circuit being adapted to regulate a voltage at the negative input terminal in response to the comparator output signal if the negative input terminal is selected;

wherein the first voltage regulation circuit comprises a controller and a first programmable attenuator connected to the positive input terminal of the receiver unit;

wherein the second voltage regulation circuit comprises the controller and a second programmable attenuator connected to the negative input terminal of the receiver unit;

wherein the first programmable attenuator includes a first M-bit controlled resistor array, the first M-bit controlled resistor array being adapted to regulate an amplitude of the voltage at the positive input terminal of the receiver unit; and wherein the second programmable attenuator includes a second M-bit controlled resistor array, the second M-bit controlled resistor array being adapted to regulate an amplitude of the voltage at the negative input terminal of the receiver unit.

10. A method for stabilizing differential input voltages of a receiver unit in a contactless communication device, comprising:

receiving differential input voltages at differential input terminals of the receiver unit, said receiving differential input voltages including receiving a voltage at a positive input terminal of the receiver unit and receiving a voltage at a negative input terminal of the receiver unit;

generating a first comparator output signal indicative of a relationship between the voltage at the positive input terminal of the receiver unit and a first reference voltage;

generating a second comparator output signal indicative of a relationship between the voltage at the negative input terminal of the receiver unit and a second reference voltage;

regulating the voltage at the positive input terminal of the receiver unit in response to the first comparator output signal; and regulating the voltage at the negative input terminal of the receiver unit in response to the second comparator output signal.

11. The method of claim 10, wherein regulating the voltage at the positive input terminal of the receiver unit includes regulating an amplitude and a phase of the voltage at the positive input terminal of the receiver unit; and wherein regulating the voltage at the negative input terminal of the receiver unit includes regulating an amplitude and a phase of the voltage at the negative input terminal of the receiver unit.

12. A contactless communication device comprising:

a receiver unit having differential input terminals for connecting to an antenna, said differential input terminals of the receiver unit including a positive input terminal and a negative input terminal;

a first voltage regulation circuit coupled to the positive input terminal of the receiver unit, the first voltage regulation circuit being adapted to regulate a voltage at the positive input terminal in response to a first output signal of the receiver unit, the first output signal including information related to the voltage at the positive input terminal of the receiver unit; and a second voltage regulation circuit coupled to the negative input terminal of the receiver unit, the second voltage regulation circuit being adapted to regulate a voltage at the negative input terminal in response to a second output signal of the receiver unit, the second output signal including information related to the voltage at the negative input terminal of the receiver unit;

wherein the first voltage regulation circuit comprises a controller and a first programmable attenuator connected to the positive input terminal of the receiver unit; and wherein the second voltage regulation circuit comprises the controller and a second programmable attenuator connected to the negative input terminal of the receiver unit;

wherein the first programmable attenuator includes a first M-bit controlled resistor array, the first M-bit controlled resistor array being adapted to regulate an amplitude of the voltage at the positive input terminal of the receiver unit; and wherein the second programmable attenuator includes a second M-bit controlled resistor array, the second M-bit controlled resistor array being adapted to regulate an amplitude of the voltage at the negative input terminal of the receiver unit.

* * * * *